(12) United States Patent
Ding et al.

(10) Patent No.: US 12,176,873 B2
(45) Date of Patent: Dec. 24, 2024

(54) METHOD AND CIRCUIT FOR DYNAMIC RANGE CONTROL BASED ON PEAK LEVEL AND RMS LEVEL DOUBLE-LEVEL DETECTION

(71) Applicant: Suzhou Zhisheng Semiconductor Technology Co., Ltd., Shanghai (CN)

(72) Inventors: Shuangxi Ding, Shanghai (CN); Hua Cao, Shanghai (CN)

(73) Assignee: Suzhou Zhisheng Semiconductor Technology Co., Ltd., Shanghai (CN)

( * ) Notice: Subject to any disclaimer, the term of this patent is extended or adjusted under 35 U.S.C. 154(b) by 0 days.

(21) Appl. No.: 18/408,437

(22) Filed: Jan. 9, 2024

(65) Prior Publication Data

US 2024/0396513 A1 Nov. 28, 2024

(30) Foreign Application Priority Data

May 26, 2023 (CN) .......................... 202310605845.2

(51) Int. Cl.
*H03G 7/00* (2006.01)
*H03G 3/00* (2006.01)
(Continued)

(52) U.S. Cl.
CPC ............. *H03G 7/007* (2013.01); *H03G 3/002* (2013.01); *H03G 5/005* (2013.01); *H03G 5/165* (2013.01); *H03G 7/002* (2013.01)

(58) Field of Classification Search
CPC ........ H03G 7/007; H03G 7/002; H03G 3/002; H03G 5/005; H03G 5/165
See application file for complete search history.

(56) References Cited

U.S. PATENT DOCUMENTS

| 2011/0085677 | A1* | 4/2011 | Walsh ...................... H03G 9/18 |
| | | | 381/94.3 |
| 2016/0211821 | A1* | 7/2016 | Grosche ................. H03G 7/002 |
| 2023/0033662 | A1* | 2/2023 | Shih ........................ H03G 5/005 |

FOREIGN PATENT DOCUMENTS

| CN | 103325380 | 9/2013 |
| CN | 108683978 | 10/2018 |

(Continued)

OTHER PUBLICATIONS

Yangang Li, "Research on Audio Processing Techniques for Multi-Channel Broadcast Sources", Thesis of Master Degree, Jan. 16, 2016, School of Electronic and Optical Engineering, Nanjing University of Science and Technology, with English abstract thereof, pp. 1-9.

(Continued)

*Primary Examiner* — Daniel R Sellers
(74) *Attorney, Agent, or Firm* — JCIPRNET (57) ABSTRACT

The present application relates to a method and a circuit for dynamic range control based on peak level and RMS level double-level detection. The method includes: processing an input signal by an equalizer, to obtain an equalized signal; detecting a signal peak level and a signal RMS level of the equalized signal, to obtain the signal peak level and the signal RMS level; adjusting a parameter configuration of a dynamic range controller according to the signal peak level and the signal RMS level; adjusting a dynamic gain of the dynamic range controller according to the parameter configuration, and adjusting the equalized signal by using the adjusted gain, and then outputting the adjusted equalized signal. The method can not only control the dynamic range of the signal but also improve the clipping distortion of the signal.

8 Claims, 2 Drawing Sheets

(51) Int. Cl.
*H03G 5/00* (2006.01)
*H03G 5/16* (2006.01)

(56) References Cited

FOREIGN PATENT DOCUMENTS

| | | | | |
|---|---|---|---|---|
| CN | 112004177 | 11/2020 | | |
| CN | 115668368 | 1/2023 | | |
| CN | 115691543 | 2/2023 | | |
| EP | 2009786 A1 * | 12/2008 | ............. | H03G 3/001 |

OTHER PUBLICATIONS

"Office Action of China Counterpart Application", issued on Jul. 3, 2023, with partial English translation thereof, p. 1-p. 8.
"Notice of allowance of China Counterpart Application", issued on Jul. 16, 2023, with English translation thereof, p. 1-p. 5.

\* cited by examiner

METHOD AND CIRCUIT FOR DYNAMIC RANGE CONTROL BASED ON PEAK LEVEL AND RMS LEVEL DOUBLE-LEVEL DETECTION

CROSS-REFERENCE TO RELATED APPLICATION

This application claims the priority benefit of China application serial no. 202310605845.2, filed on May 26, 2023. The entirety of the above-mentioned patent application is hereby incorporated by reference herein and made a part of this specification.

TECHNICAL FIELD

The present application relates to the field of audio signal processing technologies, and in particular, to a method and a circuit for dynamic range control based on peak level and RMS level double-level detection.

BACKGROUND

At present, due to the limitations of structural dimension, cost, and portability, the low-frequency reproduction capacity of loudspeaker products is limited. For products that reproduce over a digital flow, typically bass enhancement and compensation is introduced by digital equalizers. For large signal inputs, this often causes numeric overflow leading to clipping. A clipped signal is a direct current signal for loudspeakers, which not only affects the sound quality of reproduction but may also damage the loudspeakers.

Dynamic Range Control (DRC) maps the dynamic range of an input audio signal to a specified dynamic range, which can amplify the softer parts of the audio and attenuate the louder parts of the audio in volume, that is a signal amplitude adjustment manner. Typically, the post-mapping dynamic range is smaller than the dynamic range before mapping, and therefore this mapping is called dynamic range compression. Currently, the commonly used dynamic range controllers have two types: peak level detection processing and RMS level detection processing. A peak level dynamic range controller, if the absolute value of an input signal amplitude exceeds a preset threshold, will start to perform compressing the input signal, which is prone to the phenomenon of the signal being suddenly attenuated and suddenly amplified. For an RMS level dynamic range controller, a detection process of the RMS level of an input signal is required, and the RMS level dynamic range controller will start to perform compressing the input signal only when the RMS level of the input signal exceeds a preset threshold. For the clipped signal caused by the previous enhancement processing of the equalizer, the dynamic range controller outputs the clipped signal to a later stage before having enough time to start the processing. Therefore, there is a need for an improved dynamic range control algorithm to overcome the limitations of existing algorithms.

SUMMARY

Based on this, it is necessary to provide a method and a circuit for dynamic range control based on peak level and RMS level double-level detection to address the above technical problems.

A method for dynamic range control based on peak level and RMS level double-level detection, includes:

processing an input signal by an equalizer, to obtain an equalized signal;

detecting a signal peak level and a signal RMS level of the equalized signal, to obtain the signal peak level and the signal RMS level;

adjusting a parameter configuration of a dynamic range controller according to the signal peak level and a weighted signal RMS level; and adjusting a dynamic gain of the dynamic range controller according to the parameter configuration, and adjusting the equalized signal by using the adjusted dynamic gain, and then outputting the adjusted equalized signal.

In an embodiment, detecting the signal peak level and the signal RMS level of the equalized signal, to obtain the signal peak level and the signal RMS level includes:

detecting a peak level of the equalized signal of each frame, to obtain the signal peak level as:

$$A[n]=20*\log 10(\text{abs}(x[n]));$$

where $A[n]$ is a signal logarithmic peak level of a current frame, in dBV; and $x[n]$ is the equalized signal; and setting level detecting time, and calculating the signal RMS level of the equalized signal according to the level detecting time and a sampling frequency of the input signal; where the signal RMS level is:

$$B_0[n] = 20*\log10(y[n]);$$
$$y[n] = (1-\alpha)*y[n-1] + \alpha*\text{abs}(x[n]);$$
$$\alpha = 1 - \exp - 1/(Fs*energyTime);$$

where $y[n]$ is a signal RMS level of the current frame; $n$ is a sequence number of a signal frame; $y[n-1]$ is a signal RMS level of a previous frame; energyTime is the level detecting time; Fs is the sampling frequency of the input signal; $B_0[n]$ is a signal logarithmic RMS level of the current frame, in dBV; $\alpha$ is a level detecting time coefficient.

In an embodiment, adjusting the parameter configuration of the dynamic range controller according to the signal peak level and the weighted signal RMS level includes: setting a weight coefficient of the signal logarithmic RMS level, and weighting the signal logarithmic RMS level according to the weight coefficient, to obtain a weighted signal logarithmic RMS level as:

$$B[n]=w_0*B_0[n];$$

where $B[n]$ is the weighted signal logarithmic RMS level of the current frame, in dBV; $B_0[n]$ is the signal logarithmic RMS level of the current frame, in dBV; $w_0$ is the weight coefficient;

setting two sets of parameter configuration; where the parameter configuration includes attack time, release time, and a threshold; and comparing the signal logarithmic peak level with the weighted signal logarithmic RMS level to obtain a comparison result;

when the comparison result is that the signal logarithmic peak level is greater than the weighted signal logarithmic RMS level, setting the parameter configuration of the dynamic range controller as a first set of parameter configurations; and when the comparison result is that the signal logarithmic peak level is not greater than the weighted signal logarithmic RMS level, setting the parameter configuration of the dynamic range controller as a second set of parameter configurations.

In an embodiment, adjusting the dynamic gain of the dynamic range controller according to the parameter configuration, adjusting the equalized signal by using the adjusted gain, and then outputting the adjusted equalized signal includes:

when the parameter configuration of the dynamic range controller is the first set of parameter configurations, adjusting the dynamic gain of the dynamic range controller according to the first set of parameter configurations, to obtain the dynamic gain of the dynamic range controller as:

$$\text{gain}[n] = (1 - \alpha_1) * \text{gain}[n-1] + \alpha_1 * deltaGain[n];$$

$$deltaGain = \min(A[n], \text{threshold1}) - A[n];$$

$$\alpha_1 = \begin{cases} 1 - \exp(-1/(Fs * releaseTime1)), & A[n] \leq \text{threshold1} \\ 1 - \exp(-1/(Fs * attackTime1)), & A[n] > \text{threshold1} \end{cases};$$

where gain[n] is a dynamic gain of the current frame; gain[n−1] is a dynamic gain of the previous frame; attackTime1, releaseTime1, and threshold1 are the attack time, the release time and the threshold of the first set of parameter configurations, respectively; A[n] is the signal logarithmic peak level of the current frame; deltaGain is an intermediate variable, and deltaGain is equal to a smaller value between the signal logarithmic peak level A[n] of the current frame and a threshold threshold1 minus the signal logarithmic peak level A[n] of the current frame, in dBV; when A[n]=<threshold1, $\alpha_1$ is a DRC (dynamic range controller) release time coefficient; when A[n]>threshold1, $\alpha_1$ is a DRC attack time coefficient;

when the parameter configuration of the dynamic range controller is the second set of parameter configurations, adjusting the dynamic gain of the dynamic range controller according to the second set of parameter configurations, to obtain the dynamic gain of the dynamic range controller as:

$$\text{gain}[n] = (1 - \alpha_2) * \text{gain}[n-1] + \alpha_2 * deltaGain[n];$$

$$deltaGain = \min(B[n], \text{threshold2}) - B[n];$$

$$\alpha_2 = \begin{cases} 1 - \exp(-1/(Fs * releaseTime2)), & B[n] \leq \text{threshold2} \\ 1 - \exp(-1/(Fs * attackTime2)), & B[n] > \text{threshold2} \end{cases};$$

where attackTime2, releaseTime2, and threshold2 are the attack time, the release time and the threshold of the second set of parameter configurations, respectively; B[n] is the weighted signal logarithmic RMS level of the current frame; deltaGain is an intermediate variable, and deltaGain is equal to a smaller value between the weighted signal logarithmic RMS level B[n] of the current frame and the threshold threshold2 minus the weighted signal logarithmic RMS level B[n] of the current frame; when B[n]≤threshold2, $\alpha_2$ is a DRC release time coefficient; when B[n]>threshold2, $\alpha_2$ is a DRC attack time coefficient; and adjusting the equalized signal according to the dynamic gain and then outputting the adjusted equalized signal by using the dynamic range controller.

In an embodiment, adjusting the equalized signal according to the dynamic gain and then outputting the adjusted equalized signal by using the dynamic range controller includes:

weighting the dynamic gain for all frames, and adjusting the equalized signal according to the weighted dynamic gain for all frames, and then outputting the adjusted equalized signal by the dynamic range controller.

In an embodiment, the weighted dynamic gain is:

$$gainW[n] = w * 10^{(\text{gain}[n]/20)}$$

where gainW[n] is the weighted dynamic gain of the current frame, in 1; gain[n] is the dynamic gain of the current frame before weighting, in dB; and w is a real constant.

In an embodiment, the adjusted equalized signal is:

$$x_{out}[n] = gainW[n] * x[n]$$

where the $x_{out}[n]$ is the adjusted equalized signal of the current frame; and the x[n] is the equalized signal output by the equalizer.

In an embodiment, adjusting the equalized signal according to the weighted dynamic gain for all frames and then outputting the adjusted equalized signal by the dynamic range controller includes:

when gainW[n]=1 the equalized signal x[n] output by the equalizer is output in a pass-through manner;

when 0<gainW[n]<1, the equalized signal x[n] output by the equalizer is output in an attenuated manner;

when gainW[n]>1 the equalized signal x[n] output by the equalizer is output in an amplified manner;

when gainW[n]=0, and $x_{out}[n]=0$, the equalized signal x[n] output by the equalizer is blocked.

A circuit for dynamic range control based on peak level and RMS level double-level detection, where the circuit includes: an equalizer, a peak level detection sub-circuit, an RMS level detection sub-circuit, a dynamic range controller, and a parameter configuration sub-circuit; where, the equalizer is configured to process an input signal in real time to obtain an equalized signal, and output the equalized signal to the peak level detection sub-circuit, the RMS level detection sub-circuit and the dynamic range controller;

the peak level detection sub-circuit is configured to receive the equalized signal, continuously detect a peak level of the equalized signal of each frame to obtain a signal peak level, and transmit the signal peak level to the parameter configuration sub-circuit;

the RMS level detection sub-circuit is configured to receive the equalized signal, set level detecting time, calculate a signal RMS level of the equalized signal according to the level detecting time and a sampling frequency of the input signal to obtain the signal RMS level, and transmit the signal RMS level to the parameter configuration sub-circuit;

the parameter configuration sub-circuit is configured to adjust a parameter configuration of the dynamic range controller according to the received signal peak level and signal RMS level, and assign the parameter configuration to the dynamic range controller;

the dynamic range controller includes a dynamic range control sub-circuit which is configured to adjust the equalized signal according to the assigned parameter configuration and then output the adjusted equalized signal.

In an embodiment, the parameter configuration sub-circuit includes a gain sub-circuit, a comparator and a setting sub-circuit;

the gain sub-circuit is configured to weight the received signal RMS level, and output the weighted signal RMS level to the comparator;

the comparator is configured to compare the received signal peak level with the weighted signal RMS level to obtain a comparison result, and transmit the comparison result to the setting sub-circuit;

the setting sub-circuit is configured to: set two sets of parameter configurations; when the comparison result is that the signal peak level is greater than the weighted signal RMS level, set the parameter configuration of the dynamic range controller as a first set of parameter configurations; and when the comparison result is that the signal peak level is not greater than the weighted signal RMS level, set the parameter configuration of the dynamic range controller as a second set of parameter configurations; where the parameter configuration includes attack time, release time, and a threshold.

In an embodiment, the setting sub-circuit is further configured to:

when the parameter configuration of the dynamic range controller is the first set of parameter configurations, adjust a dynamic gain of the dynamic range controller according to the first set of parameter configurations, to obtain the dynamic gain of the dynamic range controller as:

$$gain[n] = (1 - \alpha_1) * gain[n-1] + \alpha_1 * deltaGain[n];$$

$$deltaGain = \min(A[n], threshold1) - A[n];$$

$$\alpha_1 = \begin{cases} 1 - \exp(-1/(Fs * releaseTime1)), & A[n] \le threshold1 \\ 1 - \exp(-1/(Fs * attackTime1)), & A[n] > threshold1 \end{cases};$$

where gain[n] is a dynamic gain of a current frame; gain[n−1] is a dynamic gain of a previous frame; attackTime1, releaseTime1, and threshold1 are the attack time, the release time, and the threshold of the first set of parameter configurations respectively; deltaGain is an intermediate variable; A[n] is a signal logarithmic peak level of the current frame; deltaGain is equal to a smaller value between the signal logarithmic peak level A[n] of the current frame and the threshold threshold1 minus the signal logarithmic peak level A[n] of the current frame, in dBV; when A[n]=<threshold1, $\alpha_1$ is a DRC (dynamic range controller) release time coefficient; when A[n]>threshold1, $\alpha_1$ is a DRC attack time coefficient;

when the parameter configuration of the dynamic range controller is the second set of parameter configurations, adjust the dynamic gain of the dynamic range controller according to the second set of parameter configurations, to obtain the dynamic gain of the dynamic range controller as:

$$gain[n] = (1 - \alpha_2) * gain[n-1] + \alpha_2 * deltaGain[n];$$

$$deltaGain = \min(B[n], threshold2) - B[n];$$

$$\alpha_2 = \begin{cases} 1 - \exp(-1/(Fs * releaseTime2)), & B[n] \le threshold2 \\ 1 - \exp(-1/(Fs * attackTime2)), & B[n] > threshold2 \end{cases};$$

where attackTime2, releaseTime2, and threshold2 are the attack time, the release time, and the threshold of the second set of parameter configurations respectively; B[n] is a weighted signal logarithmic RMS level of the current frame; deltaGain is an intermediate variable; deltaGain is equal to a smaller value between the weighted signal logarithmic RMS level B[n] of the current frame and the threshold threshold2 minus the weighted signal logarithmic RMS level B[n] of the current frame; when B[n]≤threshold2, $\alpha_2$ is the DRC release time coefficient; when B[n]>threshold2, $\alpha_2$ is the DRC attack time coefficient; adjust the equalized signal according to the dynamic gain, and then output the adjusted equalized signal by using the dynamic range controller.

In an embodiment, the dynamic range controller further includes a gain weighting processing sub-circuit.

the gain weighting processing sub-circuit is configured to weight the dynamic gain, and transmit the weighted dynamic gain to the dynamic range control sub-circuit.

In an embodiment, the signal RMS level detected by the RMS level detection sub-circuit is:

$$B_0[n] = 20 * \log10(y[n]);$$

$$y[n] = (1 - \alpha) * y[n-1] + \alpha * abs(x[n]);$$

$$\alpha = 1 - \exp(-1/(Fs * energyTime));$$

where y [n] is a signal RMS level of the current frame; n is a sequence number of a signal frame; y[n−1] is a signal RMS level of the previous frame; x[n] is the equalized signal; energyTime is the level detecting time; Fs is the sampling frequency of the input signal; $B_0[n]$ is a signal logarithmic RMS level of the current frame, $\alpha$ is a level detecting time coefficient.

In an embodiment, the signal peak level obtained by the peak level detection sub-circuit is:

$$A[n]=20*\log 10(abs(x[n]));$$

where A[n] is the signal logarithmic peak level of a current frame, in dBV; and x[n] is the equalized signal.

In an embodiment, the signal RMS level obtained by the RMS level detection sub-circuit is:

$$B_0[n] = 20 * \log10(y[n]);$$

$$y[n] = (1 - \alpha) * y[n-1] + \alpha * abs(x[n]);$$

$$\alpha = 1 - \exp(-1/(Fs * energyTime));$$

where y [n] is a signal RMS level of a current frame; n is a sequence number of a signal frame; y [n−1] is a signal RMS level of the previous frame; energyTime is the level detecting time; Fs is the sampling frequency of the input signal; $B_0[n]$ is a signal logarithmic RMS level of the current frame, in dBV; $\alpha$ is a level detecting time coefficient.

In an embodiment, the gain sub-circuit is further configured to:

set a weight coefficient of the signal RMS level, and weight the signal RMS level according to the weight coefficient, to obtain the weighted signal RMS level as:

$$B[n]=w_0*B_0[n];$$

where B[n] is a weighted signal logarithmic RMS level of a current frame, in dBV; $B_0[n]$ is a signal logarithmic RMS level of a current frame, in dBV; $w_0$ is the weight coefficient.

In an embodiment, the weighted dynamic gain obtained by the gain weighting processing sub-circuit is:

$$gainW[n]=w*10^{\wedge}(gain[n]/20)$$

where gainW[n] is the weighted dynamic gain of the current frame, in 1; gain[n] is the dynamic gain of the current frame before weighting, in dB; and W is a real constant.

In an embodiment, the dynamic range control sub-circuit is further configured to receive the weighted dynamic gain, adjust the equalized signal according to the weighted dynamic gain and then output the adjusted equalized signal as:

$$x_{out}[n]=\text{gainW}[n]*x[n]$$

where the $x_{out}[n]$ is the processed equalized signal of the current frame; and the x[n] is the equalized signal output by the equalizer.

In an embodiment, the dynamic range control sub-circuit is further configured to:
when gainW[n]=1, output the equalized signal x[n] output by the equalizer in a pass-through manner;
when 0<gainW[n]<1 output the equalized signal x[n] output by the equalizer in an attenuated manner;
when gainW [n]>1 output the equalized signal x [n] output by the equalizer in an amplified manner;
when gainW[n] and $x_{out}[n]$=0, block the equalized signal x[n] output by the equalizer.

According to the method and the circuit for dynamic range control based on peak level and RMS level double-level detection described above, the method includes: processing an input audio digital signal by an equalizer, to obtain an equalized signal; detecting a signal peak level and a signal RMS level of the equalized signal, to obtain the signal peak level and the signal RMS level; adjusting a parameter configuration of a dynamic range controller according to the signal peak level and the signal RMS level; and adjusting a dynamic gain of the dynamic range controller according to the parameter configuration, and adjusting the equalized signal by using the adjusted gain, and then outputting the adjusted equalized signal. The method can not only control the dynamic range of the signal but also improve the clipping distortion of the signal.

DESCRIPTION OF EMBODIMENTS

For clarity of the purpose, technical solutions, and advantages of the present application, the present application will be further described in detail below with reference to the drawings and embodiments. It should be understood that the specific embodiments described herein are only intended to explain the present application and not to limit the present application.

Figure 1:
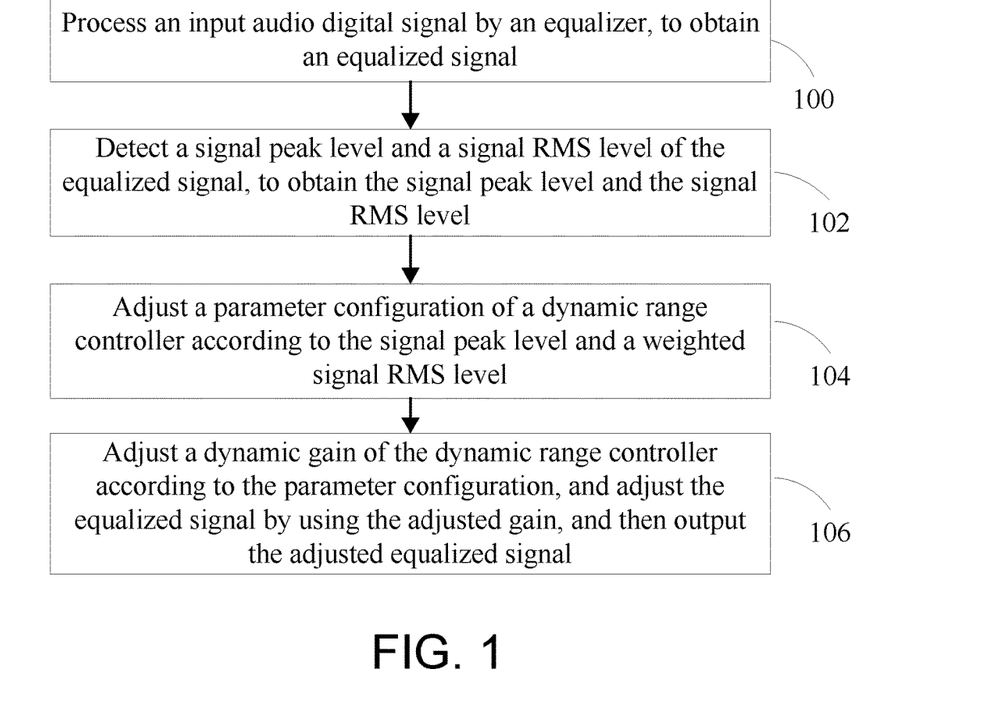
FIG. 1 is a schematic flow chart of a method for dynamic range control based on peak level and RMS level double-level detection provided in an embodiment.

In an embodiment, as shown in FIG. 1, a method for dynamic range control based on peak level and RMS level double-level detection is provided. The method includes the following steps:
step 100, process an input audio digital signal by an equalizer, to obtain an equalized signal;
step 102, detect a signal peak level and a signal RMS level of the equalized signal, to obtain the signal peak level and the signal RMS level;
step 104, adjust a parameter configuration of a dynamic range controller according to the signal peak level and a weighted signal RMS level; and
step 106, adjust a dynamic gain of the dynamic range controller according to the parameter configuration, and adjust the equalized signal by using the adjusted gain, and then output the adjusted equalized signal.

In the above method for dynamic range control based on peak level and RMS level double-level detection, the method includes: processing an input audio digital signal by an equalizer, to obtain an equalized signal; detecting a signal peak level and a signal RMS level of the equalized signal, to obtain the signal peak level and the signal RMS level; adjusting a parameter configuration of a dynamic range controller according to the signal peak level and the signal RMS level; and adjusting a dynamic gain of the dynamic range controller according to the parameter configuration, and adjusting the equalized signal by using the adjusted gain, and then outputting the adjusted equalized signal. The method can not only control the dynamic range of the signal but also improve the clipping distortion of the signal.

In an embodiment, step 102 includes:
detecting a peak level of the equalized signal of each frame, to obtain the signal peak level as:

$$A[n]=20*\log 10(\text{abs}(x[n]));$$

where A[n] is a logarithmic peak level of a signal of a current frame, in dBV; and x[n] is the equalized signal; and
setting level detecting time, and calculate the signal RMS level of the equalized signal according to the level detecting time and a sampling frequency of the input signal; where the signal RMS level is:

$$B_0[n] = 20 * \log10(y[n]);$$

$$y[n] = (1-\alpha)*y[n-1] + \alpha*\text{abs}(x[n]);$$

$$\alpha = 1 - \exp(-1/(Fs*energyTime));$$

where y[n] is a signal RMS level ("RMS level" is also referred to as "effective level" or "effective value") of the current frame; n is a sequence number of a signal frame; y[n−1] is a signal RMS level of a previous frame; energyTime is the level detecting time; Fs is the sampling frequency of the input signal; $B_0[n]$ is a logarithmic RMS level of the signal of the current frame, in dBV; α is a level detecting time coefficient.

In an embodiment, step 104 includes:
setting a weight coefficient of the logarithmic RMS level of the signal, and weight the logarithmic RMS level of the signal according to the weight coefficient, to obtain a weighted logarithmic RMS level of the signal as:

$$B[n]=w_0*B_0[n];$$

where B[n] is the weighted logarithmic RMS level of the signal of the current frame, in dBV; $B_0[n]$ is the logarithmic RMS level of the signal of the current frame, in dBV; $w_0$ is the weight coefficient;
setting two sets of parameter configurations; the parameter configuration includes attack time, release time, and a threshold; and
comparing the logarithmic peak level of the signal with the weighted logarithmic RMS level of the signal, to obtain a comparison result;
when the comparison result is that the logarithmic peak level of the signal is greater than the weighted logarithmic RMS level of the signal, setting a parameter of the dynamic range controller as a first set of parameter configurations;

when the comparison result is that the logarithmic peak level of the signal is not greater than the weighted logarithmic RMS level of the signal, setting the parameter of the dynamic range controller as a second set of parameter configurations.

In an embodiment, the step 106 includes:

when the parameter of the dynamic range controller is the first set of parameter configurations, adjusting the dynamic gain of the dynamic range controller according to the parameter configuration, to obtain the dynamic gain of the dynamic range controller as:

$$\text{gain}[n] = (1 - \alpha_1) * \text{gain}[n-1] + \alpha_1 * \text{deltaGain}[n];$$

$$\text{deltaGain} = \min(A[n], \text{threshold1}) - A[n];$$

$$\alpha_2 = \begin{cases} 1 - \exp(-1/(Fs * \text{releaseTime1})), & A[n] \le \text{threshold1} \\ 1 - \exp(-1/(Fs * \text{attackTime1})), & A[n] > \text{threshold1} \end{cases};$$

where gain[n] is a dynamic gain of the current frame, gain[n−1] is a dynamic gain of the previous frame, attackTime1, releaseTime1, and threshold1 are the attack time, the release time and the threshold of the first set of parameter configurations respectively, A[n] is the logarithmic peak level of the signal of the current frame, deltaGain is an intermediate variable, and deltaGain is equal to a smaller value between the logarithmic peak level A[n] of the signal of the current frame and a DRC threshold threshold1 minus the logarithmic peak level A[n] of the signal of the current frame, in dBV; when A[n]=<threshold1, $\alpha_1$ is a DRC release time coefficient; when A[n]>threshold1, $a_1$ is a DRC attack time coefficient;

when the parameter of the dynamic range controller is the second set of parameter configurations, adjusting the dynamic gain of the dynamic range controller according to the parameter configuration, to obtain the dynamic gain of the dynamic range controller as:

$$\text{gain}[n] = (1 - \alpha_2) * \text{gain}[n-1] + \alpha_2 * \text{deltaGain}[n];$$

$$\text{deltaGain} = \min(B[n], \text{threshold2}) - B[n];$$

$$\alpha_2 = \begin{cases} 1 - \exp(-1/(Fs * \text{releaseTime2})), & B[n] \le \text{threshold2} \\ 1 - \exp(-1/(Fs * \text{attackTime2})), & B[n] > \text{threshold2} \end{cases};$$

where attackTime2, releaseTime2, and threshold2 are the attack time, the release time and the threshold of the second set of parameter configurations respectively, B[n] is the weighted logarithmic RMS level of the signal of the current frame, deltaGain is an intermediate variable, and deltaGain is equal to a smaller value between the weighted logarithmic RMS level B[n] of the signal of the current frame and a DRC threshold threshold2 minus the weighted logarithmic RMS level B[n] of the signal of the current frame; when B[n]≤threshold2, $\alpha_2$ is a DRC release time coefficient; when B[n]>threshold2, $\alpha_2$ is a DRC attack time coefficient; and adjusting the equalized signal according to the dynamic gain and then output the adjusted equalized signal by using the dynamic range controller.

In an embodiment, adjusting the equalized signal according to the dynamic gain and then outputting the adjusted equalized signal using the dynamic range controller includes: weighting the dynamic gain for all frames, adjusting the equalized signal according to the weighted dynamic gain and then outputting the adjusted equalized signal by the dynamic range controller.

It should be understood that although various steps in the flowchart shown in FIG. 1 are shown in sequence as indicated by arrows, these steps are not necessarily executed in the order indicated by arrows. Unless explicitly stated herein, there is no strict order restriction on the execution of these steps, and these steps can be executed in other orders. Moreover, at least some of the steps in FIG. 1 may include multiple sub-steps or multiple stages. These sub-steps or stages are not necessarily executed or finished at the same time but may be executed at different time. These sub-steps or stages are not necessarily executed in sequence but can be executed in turn or alternately with other steps or at least a part of sub-steps or stages of other steps.

Figure 2:
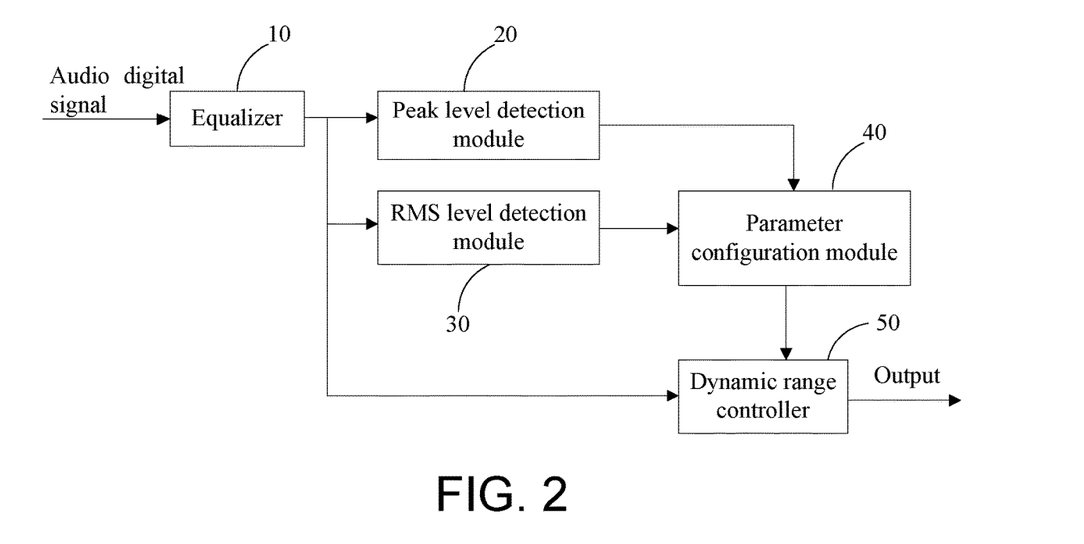
FIG. 2 illustrates a block diagram of a structure for dynamic range control based on peak level and RMS level double-level detection provided in an embodiment.

In an embodiment, as shown in FIG. 2, a circuit for dynamic range control based on peak level and RMS level double-level detection is provided. The circuit includes: an equalizer 10, a peak level detection module 20, an RMS level detection module 30, a dynamic range controller 50, and a parameter configuration module 40.

The equalizer 10 is configured to process an input audio digital signal in real time to obtain an equalized signal, and output the equalized signal to the peak level detection module 20, the RMS level detection module 30 and the dynamic range controller 50. Since the low-frequency cutoff frequency of the speaker system is relatively high, in order to obtain a better bass response at a low volume, the low-frequency signal is often boosted in the equalizer module. When a signal is input to the equalizer module at a high volume for gain amplification processing, clipping will often occur due to high overflow. The input audio digital signal $x_{in}[n]$ is processed by the equalizer and output as x[n] thereafter.

The peak level detection module 20 is configured to receive the equalized signal, continuously detect a peak level of the equalized signal of each frame to obtain a signal peak level, and transmit the signal peak level to the parameter configuration module 40. The peak detection module 20 is configured to continuously take an absolute value of the value x[n] (in V) of the equalized signal of each frame and convert the unit V into dBV, where a logarithmic peak level of the signal of a current frame is A[n]=20*log 10(abs(x [n])).

The RMS level detection module 30 is configured to receive the equalized signal, set level detecting time, calculate a signal RMS level of the equalized signal according to the level detecting time and a sampling frequency of the input signal to obtain the signal RMS level, and transmit the signal RMS level to the parameter configuration module 40.

The parameter configuration module 40 is configured to adjust a parameter configuration of the dynamic range controller according to the received signal peak level and signal RMS level, and assign it to the dynamic range controller 50. Adjusting the parameter configuration of the dynamic range controller according to the signal peak level and the weighted signal RMS level may also include using only one set of parameter configuration or using multiple sets of parameter configurations.

The dynamic range controller 50 includes a dynamic range control module which is configured to perform processing on the equalized signal, according to the assigned configuration parameter, and then output the processed equalized signal. The dynamic range controller includes three input parameters: attack time (attackTime), release time (releaseTime) and a threshold (threshold).

Figure 3:
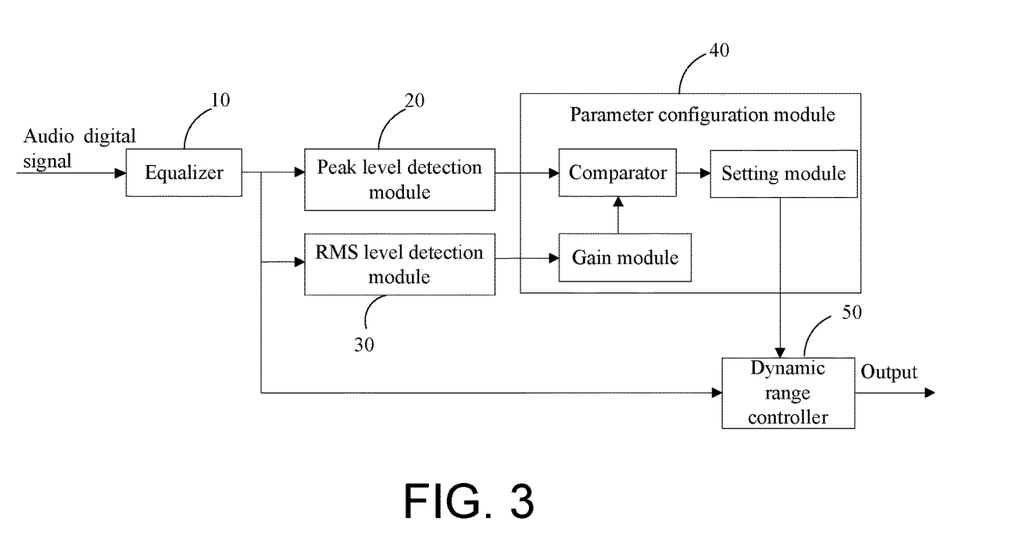
FIG. 3 illustrates a block diagram of a structure for dynamic range control based on peak level and RMS level double-level detection provided in an embodiment.

In an embodiment, as shown in FIG. 3, the parameter configuration module includes a gain module, a comparator and a setting module.

The gain module is configured to weight the received signal RMS level, and output the weighted signal RMS level to the comparator. Specifically, the gain module is configured to amplify or attenuate the signal RMS level calculated by the RMS level detection module, where the weighted logarithmic RMS level of the signal is: $B[n]=w_0*B_0[n]$, where $w_0$ is a real constant, which can be set by a user according to actual needs.

The comparator is configured to compare the received signal peak level with the weighted signal RMS level to obtain a comparison result, and transmit the comparison result to the setting module.

The setting module is configured to: set two sets of parameter configurations; when the comparison result is that the signal peak level is greater than the weighted signal RMS level, set a parameter of the dynamic range controller as a first set of parameter configurations; and when the comparison result is that the signal peak level is not greater than the weighted signal RMS level, set the parameter of the dynamic range controller as a second set of parameter configurations; where the parameter configuration includes attack time, release time, and a threshold.

Specifically, the first set of parameter configurations is parameter configuration C, including the attack time attackTime1, the release time releaseTime1 and the threshold threshold1. The second set of parameter configurations is parameter configuration D, including the attack time attackTime2, the release time releaseTime2, and the threshold threshold2. Users can set the values of the parameters themselves.

In an embodiment, the setting module is further configured to:

when the parameter of the dynamic range controller is the first set of parameter configurations, adjust a dynamic gain of the dynamic range controller according to the parameter configuration, to obtain the dynamic gain of the dynamic range controller as:

$$gain[n] = (1 - \alpha_1)*gain[n-1] + \alpha_1 * deltaGain[n];$$

$$deltaGain = \min(A[n], threshold1) - A[n];$$

$$\alpha_2 = \begin{cases} 1 - \exp(-1/(Fs*releaseTime1)), & A[n] \leq threshold1 \\ 1 - \exp(-1/(Fs*attackTime1)), & A[n] > threshold1 \end{cases};$$

where gain[n] is a dynamic gain of a current frame; gain[n−1] is a dynamic gain of a previous frame; attackTime1, releaseTime1, and threshold1 are the attack time, the release time, and the threshold of the first set of parameter configurations respectively; deltaGain is an intermediate variable; A[n] is a logarithmic peak level of the signal of the current frame; when A[n]=<threshold1, $\alpha_1$ is a DRC release time coefficient; when A[n]>threshold1, $\alpha_1$ is a DRC attack time coefficient.

when the parameter of the dynamic range controller is the second set of parameter configurations, adjust the dynamic gain of the dynamic range controller according to the parameter configuration, to obtain the dynamic gain of the dynamic range controller as:

$$gain[n] = (1 - \alpha_2)*gain[n-1] + \alpha_2 * deltaGain[n];$$

$$deltaGain = \min(B[n], threshold2) - B[n];$$

$$\alpha_2 = \begin{cases} 1 - \exp(-1/(Fs*releaseTime2)), & B[n] \leq threshold2 \\ 1 - \exp(-1/(Fs*attackTime2)), & B[n] > threshold2 \end{cases};$$

where attackTime2, releaseTime2, and threshold2 are the attack time, the release time, and the threshold of the second set of parameter configurations respectively; B[n] is a weighted logarithmic RMS level of the signal of the current frame; deltaGain is an intermediate variable; when B[n]≤threshold2, $\alpha_2$ is the DRC release time coefficient; when B[n]>threshold2, $\alpha_2$ is the DRC attack time coefficient;

adjust the equalized signal according to the dynamic gain and then output the adjusted equalized signal by using the dynamic range controller.

In an embodiment, the dynamic range controller further includes a gain weighting processing module. The gain weighting processing module is configured to weight the dynamic gain, and transmit the weighted dynamic gain to the dynamic range control module.

Specifically, the dynamic range controller can also weight the dynamic gain gain[n] through the gain weighting processing module to implement pass-through, amplification, compression, limitation and denoising of the signal x[n] output by the equalizer, that is: $x_{out}[n]=gainW[n]*x[n]$, where $gainW[n]=w*10^{\wedge}(gain[n]/20)$, W is a real constant, the unit of gain[n] is dB, the unit of gainW[n] is 1; dB is converted into 1 by $10^{\wedge}(gain[n]/20)$, and then multiplication by W is executed for weighting processing. When gainW [n]=1, the signal x[n] output by the equalizer is output in a pass-through manner; when 0<gainW[n]<1, the signal x[n] output by the equalizer is output in an attenuated manner; when gainW [n]>1, the signal x[n] output by the equalizer is output in an amplified manner, when gainW[n]=0, $x_{out}[n]$ 0 the output of the signal x[n] output by the equalizer is blocked. Users can adjust the settings according to actual needs.

In an embodiment, the signal RMS level detected by the RMS level detection module is:

$$B_0[n] = 20*\log 10(y[n]);$$

$$y[n] = (1 - \alpha)*y[n-1] + \alpha*\mathrm{abs}(x[n]);$$

$$\alpha = 1 - \exp(-1/(Fs*energyTime));$$

where y [n] is a signal RMS level of the current frame; n is a sequence number of a signal frame; y[n−1] is a signal RMS level of the previous frame; x[n] is the equalized signal; energyTime is the level detecting time; Fs is the sampling frequency of the input signal; $B_0[n]$ is a logarithmic RMS level of the signal of the current frame, α is a level detecting time coefficient.

The functions of the circuit for dynamic range control described in the specification can be realized by a combination of a plurality of subcircuits, that is, the modules (e.g., the peak level detection module, the RMS level detection module, and the parameter configuration module and so on) described in the specification can be implemented as a sub-circuit or a combination of a plurality of sub-circuits.

The technical features of the embodiments mentioned above can be combined arbitrarily. To simplify the description, not all possible combinations of the technical features in the embodiments are described. However, as long as there is no contradiction in the combination of these technical features, it should be considered to be within the scope of this specification.

The embodiments mentioned above only express several implementations provided by the present application, and the descriptions are relatively specific and detailed, but should not be construed as limiting the scope of the invention patent. It should be noted that, for those of ordinary skilled in the art, several modifications and improvements can be made without deviating from the concept of the present application, and these all fall within the protection scope of the present application. Therefore, the protection scope of the present application should be determined by the appended claims.

What is claimed is:

1. A method for dynamic range control based on peak level and effective level double-level detection, wherein the method comprises:
   processing an input audio digital signal by an equalizer, to obtain an equalized signal;
   detecting a signal peak level and a signal effective level of the equalized signal, to obtain the peak level and the signal effective level;
   adjusting a parameter configuration of a dynamic range controller according to the signal peak level and a weighted signal effective level;
   adjusting a dynamic gain of the dynamic range controller according to the parameter configuration, and adjusting the equalized signal by using the adjusted gain, and then outputting the adjusted equalized signal;
   wherein, the parameter configuration of the dynamic range controller comprises a first set of parameter configurations and a second set of parameter configurations, adjusting the dynamic gain of the dynamic range controller according to the parameter configuration, and adjusting the equalized signal by using the adjusted gain, and then outputting the adjusted equalized signal comprises:
   when the parameter configuration of the dynamic range controller is the first set of parameter configurations, adjusting the dynamic gain of the dynamic range controller according to the first set of parameter configurations, to obtain the dynamic gain of the dynamic range controller as:

$$gain[n] = (1 - \alpha_1) * gain[n-1] + \alpha_1 * deltaGain[n];$$

$$deltaGain = \min(A[n], threshold1) - A[n];$$

$$\alpha_2 = \begin{cases} 1 - \exp(-1/(Fs * releaseTime1)), & A[n] \leq threshold1 \\ 1 - \exp(-1/(Fs * attackTime1)), & A[n] > threshold1 \end{cases};$$

wherein gain [n] is a dynamic gain of the current frame; gain[n−1] is a dynamic gain of the previous frame; attackTime1, releaseTime1, and threshold1 are the attack time, the release time and the threshold of the first set of parameter configurations, respectively; A[n] is the signal logarithmic peak level of the current frame; deltaGain is an intermediate variable; deltaGain is equal to a smaller value between the signal logarithmic peak level A[n] of the current frame and a dynamic range controller (DRC) threshold threshold1 minus the signal logarithmic peak level A[n] of the current frame, in dBV; when A[n]=<threshold1, $\alpha_1$ is a DRC release time coefficient; when A[n]>threshold 1, $\alpha_1$ is a DRC attack time coefficient;

when the parameter configuration of the dynamic range controller is the second set of parameter configurations, adjusting the dynamic gain of the dynamic range controller according to the second set of parameter configurations, to obtain the dynamic gain of the dynamic range controller as:

$$gain[n] = (1 - \alpha_2) * gain[n-1] + \alpha_2 * deltaGain[n];$$

$$deltaGain = \min(B[n], threshold2) - B[n];$$

$$\alpha_2 = \begin{cases} 1 - \exp(-1/(Fs * releaseTime2)), & B[n] \leq threshold2 \\ 1 - \exp(-1/(Fs * attackTime2)), & B[n] > threshold2 \end{cases};$$

wherein attackTime2-releaseTime2, and threshold2 are the attack time, the release time and the threshold of the second set of parameter configurations, respectively; B[n] is the weighted signal logarithmic effective level of the current frame: deltaGain is an intermediate variable, and deltaGain is equal to a smaller value between the weighted signal logarithmic effective level B[n] of the current frame and a DRC threshold threshold2 minus the weighted signal logarithmic effective level B[n] of the current frame; when B[n]≤threshold2, $\alpha_2$ is a DRC release time coefficient; when B[n]>threshold2, $\alpha_2$ is a DRC attack time coefficient; and
   adjusting the equalized signal according to the dynamic gain and then outputting the adjusted equalized signal by using the dynamic range controller.

2. The method according to claim 1, wherein detecting the signal peak level and the signal effective level of the equalized signal, to obtain the signal peak level and the signal effective level comprises:
   detecting a peak level of the equalized signal of each frame, to obtain the signal peak level as:

$$A[n]=20*\log 10(abs(x[n]));$$

wherein A[n] is a signal logarithmic peak level of a current frame, in dBV; and x [n] is the equalized signal; and
   setting level detecting time, and calculating the signal effective level of the equalized signal according to the level detecting time and a sampling frequency of the input signal; wherein the signal effective level is:

$$B_0[n] = 20 * \log 10(y[n]);$$

$$y[n] = (1 - \alpha) * y[n-1] + \alpha * abs(x[n]);$$

$$\alpha = 1 - \exp(-1/(Fs * energyTime));$$

wherein y[n] is a signal effective level of the current frame; n is a sequence number of a signal frame; y[n−1] is a signal effective level of a previous frame; energyTime is the level detecting time; Fs is the sampling frequency of the input signal;
$B_0[n]$ is a signal logarithmic effective level of the current frame, in dBV; $\alpha$ is a level detecting time coefficient.

3. The method according to claim 2, wherein adjusting the parameter configuration of the dynamic range controller according to the signal peak level and the weighted signal effective level comprises:
   setting a weight coefficient of the signal logarithmic effective level, and weighting the signal logarithmic effective level according to the weight coefficient, to obtain a weighted signal logarithmic effective level as:

$$B[n]=w_0*B_0[n];$$

wherein B[n] is the weighted signal logarithmic effective level of the current frame, in dBV; B$_0$[n] is the signal logarithmic effective level of the current frame, in dBV; w$_0$ is the weight coefficient;
  setting two sets of parameter configurations; wherein the parameter configuration comprises attack time, release time, and a threshold; and
  comparing the signal logarithmic peak level with the weighted signal logarithmic effective level to obtain a comparison result;
  when the comparison result is that the signal logarithmic peak level is greater than the weighted signal logarithmic effective level, setting the parameter configuration of the dynamic range controller as a first set of parameter configurations;
  when the comparison result is that the signal logarithmic peak level is not greater than the weighted signal logarithmic effective level, setting the parameter configuration of the dynamic range controller as a second set of parameter configurations.

4. The method according to claim 3, wherein adjusting the equalized signal according to the dynamic gain and then outputting the adjusted equalized signal by using the dynamic range controller comprises:
  weighting the dynamic gain for all frames, adjusting the equalized signal according to the weighted dynamic gain for all frames and then outputting the adjusted equalized signal by the dynamic range controller.

5. A circuit for dynamic range control based on peak level and effective level double-level detection, wherein the circuit comprises: an equalizer, a peak level detection sub-circuit, an effective level detection sub-circuit, a dynamic range controller, and a parameter configuration sub-circuit; wherein,
  the equalizer is configured to process an input audio digital signal in real time to obtain an equalized signal, and output the equalized signal to the peak level detection sub-circuit, the effective level detection sub-circuit and the dynamic range controller;
  the peak level detection sub-circuit is configured to receive the equalized signal, continuously detect a peak level of the equalized signal of each frame to obtain a signal peak level, and transmit the signal peak level to the parameter configuration sub-circuit;
  the effective level detection sub-circuit is configured to receive the equalized signal, set level detecting time, calculate a signal effective level of the equalized signal according to the level detecting time and a sampling frequency of the input signal to obtain the signal effective level, and transmit the signal effective level to the parameter configuration sub-circuit;
  the parameter configuration sub-circuit is configured to adjust a parameter configuration-of the dynamic range controller according to the received signal peak level and signal effective level, and assign the parameter configuration to the dynamic range controller;
  the dynamic range controller comprises a dynamic range control sub-circuit which is configured to adjust the equalized signal according to the assigned parameter configuration-and then output the adjusted equalized signal;
  wherein, the parameter configuration of the dynamic range controller comprises a first set of parameter configurations and a second set of parameter configurations, the setting sub-circuit is further configured to:
  when the parameter configuration of the dynamic range controller is the first set of parameter configurations, adjust a dynamic gain of the dynamic range controller according to the first set of parameter configurations, to obtain the dynamic gain of the dynamic range controller as:

$$\text{gain}[n] = (1 - \alpha_1) * \text{gain}[n-1] + \alpha_1 * \text{deltaGain}[n];$$

$$\text{deltaGain} = \min(A[n], \text{threshold1}) - A[n];$$

$$\alpha_2 = \begin{cases} 1 - \exp(-1/(Fs * releaseTime1)), & A[n] \le \text{threshold1} \\ 1 - \exp(-1/(Fs * attackTime1)), & A[n] > \text{threshold1} \end{cases};$$

wherein gain [n] is a dynamic gain of a current frame; gain[n−1] is a dynamic gain of a previous frame: attackTime1 releaseTime1, and threshold1 are the attack time, the release time, and the threshold of the first set of parameter configurations respectively; deltaGain is an intermediate variable: A[n] is a signal logarithmic peak level of the current frame; deltaGain is equal to a smaller value between the signal logarithmic peak level A[n] of the current frame and the threshold threshold1 minus the signal logarithmic peak level A[n] of the current frame, in dBV; when A[n] =≤threshold1, $\alpha_1$ is a dynamic range controller (DRC) release time coefficient; when A[n]>threshold1, $\alpha_1$ is a DRC attack time coefficient;
  when the parameter configuration of the dynamic range controller is the second set of parameter configurations, adjust the dynamic gain of the dynamic range controller according to the second set of parameter configurations, to obtain the dynamic gain of the dynamic range controller as:

$$\text{gain}[n] = (1 - \alpha_2) * \text{gain}[n-1] + \alpha_2 * \text{deltaGain}[n];$$

$$\text{deltaGain} = \min(B[n], \text{threshold2}) - B[n];$$

$$\alpha_2 = \begin{cases} 1 - \exp(-1/(Fs * releaseTime2)), & B[n] \le \text{threshold2} \\ 1 - \exp(-1/(Fs * attackTime2)), & B[n] > \text{threshold2} \end{cases};$$

wherein attackTime2, releaseTime2, and threshold2 are the attack time, the release time, and the threshold of the second set of parameter configurations respectively; B[n] is a weighted signal logarithmic effective level of the current frame; deltaGain is an intermediate variable: deltaGain is equal to a smaller value between the weighted signal logarithmic effective level B[n] of the current frame and the threshold threshold2 minus the weighted signal logarithmic effective level B[n] of the current frame; when B[n]≤threshold2, $\alpha_2$ is the DRC release time coefficient; when B[n]>threshold2, $\alpha_2$ is the DRC attack time coefficient; and
  adjust the equalized signal according to the dynamic gain and then output the adjusted equalized signal by using the dynamic range controller.

6. The circuit according to claim 5, wherein the parameter configuration sub-circuit comprises: a gain sub-circuit, a comparator and a setting sub-circuit;
  the gain sub-circuit is configured to weight the received signal effective level, and output the weighted signal effective level to the comparator;
  the comparator is configured to compare the received signal peak level with the weighted signal effective level to obtain a comparison result, and transmit the comparison result to the setting sub-circuit;
  the setting sub-circuit is configured to: set two sets of parameter configurations; when the comparison result is that the signal peak level is greater than the weighted signal effective level, set the parameter configuration of the dynamic range controller as a first set of parameter configurations; and when the comparison result is that the signal peak level is not greater than the weighted signal effective level, set the parameter configuration of the dynamic range controller as a second set of parameter configurations; wherein the parameter configuration comprises attack time, release time, and a threshold.

7. The circuit according to claim 6, wherein the dynamic range controller further comprises a gain weighting processing sub-circuit, the gain weighting processing sub-circuit is configured to weight the dynamic gain, and transmit the weighted dynamic gain to the dynamic range control sub-circuit.

8. The circuit according to claim 5, wherein the signal effective level detected by the effective level detection sub-circuit is:

$$B_0[n] = 20 * \log10(y[n]);$$

$$y[n] = (1 - \alpha) * y[n-1] + \alpha * \text{abs}(x[n]);$$

$$\alpha = 1 - \exp(-1/(Fs * energyTime));$$

wherein $y[n]$ is a signal effective level of a current frame; n is a sequence number of a signal frame; $y[n-1]$ is a signal effective level of a previous frame; $x[n]$ is the equalized signal; energyTime is the level detecting time; Fs is the sampling frequency of the input signal; $B_0[n]$ is a signal logarithmic effective level of the current frame, $\alpha$ is a level detecting time coefficient.

* * * * *